US005874837A

United States Patent [19]

Manohar et al.

[11] Patent Number: 5,874,837

[45] Date of Patent: Feb. 23, 1999

[54] CMOS PECL DRIVER WITH PROGRAMMABLE CURRENT FOR VARYING VOLTAGE SWINGS AND TERMINATION TYPES

[75] Inventors: Amar S. Manohar; Bor Lee, both of San Jose, Calif.

[73] Assignee: Pericom Semiconductor Corp., San Jose, Calif.

[21] Appl. No.: 847,819

[22] Filed: Apr. 28, 1997

[51] Int. Cl.[6] ..... H03K 19/094

[52] U.S. Cl. ..... 326/83; 326/82; 326/86

[58] Field of Search ..... 326/83, 82, 86, 326/87, 27, 17

[56] References Cited

U.S. PATENT DOCUMENTS

| | | | |
|---|---|---|---|
| 5,495,184 | 2/1996 | Des Rosiers et al. | 326/73 |
| 5,541,527 | 7/1996 | Ma | 326/21 |
| 5,548,230 | 8/1996 | Gerwson et al. | 326/73 |
| 5,656,952 | 8/1997 | McCall et al. | 326/82 |
| 5,767,699 | 6/1998 | Bosnyak et al. | 326/86 |

*Primary Examiner*—Michael Tokar
*Assistant Examiner*—Daniel D. Chang
*Attorney, Agent, or Firm*—Stuart T. Auvinen

[57] ABSTRACT

A differential-output current driver is constructed entirely of CMOS transistors. Pseudo-ECL levels are reached when a standard resistive termination is connected to the outputs. The current driver can also drive a non-standard termination to the PECL levels. The non-standard termination is low power because it does not draw standby current from power to ground. Current from the current sources within the current driver are assigned to either the switching current or the constant current. The constant current is applied directly to the outputs to drive the termination to a bias point. The switching current is applied to a differential pair of transistors which switch the switching current to one or the other of the differential outputs in response to a differential input. The constant current is combined with any switching current output from the differential transistors and applied to the differential outputs to drive the external termination. For the non-standard termination, the differential outputs are driven with more constant current and less switching current than for the standard termination. The transconductance of the differential pair of transistors may also be increased when the switching current is increased. Thus the current-drive characteristics of a current driver are altered for different terminations. A half-sized voltage-swing option is also included.

23 Claims, 7 Drawing Sheets

4mA
8mA
8mA
2mA
2mA
48
46
44
42
40
76
74
72
70
69
68
66
64
62
60
OPT
OPTB
i(SW-OPT)= 4mA
i(SW)=16mA
54
52
50
INB+
INB-
TX+
TX-
i(CONST)= 4mA
i(CONST-OPT)=10mA

CMOS PECL DRIVER WITH PROGRAMMABLE CURRENT FOR VARYING VOLTAGE SWINGS AND TERMINATION TYPES

BACKGROUND OF THE INVENTION

1. Field of the Invention

This invention relates to ECL drivers implemented in CMOS, and more particularly to a PECL driver with programmable switching of current for implementing any voltage swing with standard or with non-standard termination.

2. Description of the Related Art

Today's computer networks handle an ever-increasing amount of data. Fast Ethernet transmits and receives packets at 100 Mbps, and other technologies such as asynchronous transfer mode (ATM) also require high data rates.

The highest-speed applications have traditionally used current-switching technologies such as bipolar NPN transistors arranged as emitter-coupled logic (ECL) gates and drivers. Bipolar NPN transistors have been added to complementary metal-oxide-semiconductor (CMOS) processes to support ECL. These CMOS processes with NPN transistors are known as BiCMOS. Unfortunately, such BiCMOS processes are expensive compared to standard CMOS.

CMOS operates with a 5-volt or 3-volt power supply and ground, but ECL traditionally operates with a negative power supply. Thus standard ECL voltage levels are not compatible with CMOS. A positive-voltage-shifted ECL known as pseudo-ECL (PECL) has been used for CMOS chips using ECL-type current drivers. See for example U.S. Pat. Nos. 5,495,184 and 5,089,723 which use CMOS transistors as current drivers for pseudo-ECL levels.

DIFFERENTIAL SIGNALS

ECL current drivers are often used to drive differential signals. Using a pair of signals rather than just one signal reduces sensitivity to noise and interference, since interference usually affects both signals equally, while not affecting the voltage difference between the two signals nor the difference in current driven to each signal.

FIG. 1 is a diagram of a differential pair of signals. When Signal TX+ is driven high, signal TX− is driven low. While single signals are normally driven fully to power and ground, differential signals can be driven to a smaller voltage swing using current drivers. Differential-amplifier receivers can easily detect a small voltage difference of less than a volt. Thus each signal in FIG. 1 is driven over just a 0.8-volt range, peak-to-peak, from 3.2 volts to 4.0 volts. Smaller voltage swings are desirable since output capacitances can be charged more quickly with a specified current. The high-speed PECL 100k standard uses such smaller voltage swings with differential signals.

FIG. 2 is a diagram of a differential current driver and line termination that produces the waveforms of FIG. 1. Rather than drive to specific voltage levels, current drivers switch current from one of the differential signal outputs to the other output. Each output is connected to a line termination. As current is forced through the termination, a voltage drop develops across the termination resistor. This voltage drop can be sensed by a receiver. Thus the termination is critical to determining voltage characteristics of a current-driven signal line.

Termination 16 has a 50-ohm resistor to a 3.0-volt supply. The signal line TX− has 10 pico-farads (pF) of capacitance, which must be charged and discharged by the reduced voltage swing. Likewise, signal line TX+ has a 10 pF capacitance and a 50-ohm resistance to 3.0 volts in termination 20.

A constant current is forced through each of termination 16, 20 to maintain a desired bias point. Constant current source 14 forces a 4 milli-amp (mA) current through output TX− and termination 16. For output TX+ , constant current source 24 forces a 4 mA current through termination 20.

An additional switching current is switched to one differential output or the other, depending on the logical state of the differential outputs. A logical low has TX+ at the lower voltage and output TX− at a higher voltage, while the reverse is true for a logical high, when TX+ is high and TX− is low. Variable current source 12 switches an additional 16 mA of current through termination 16 when the differential output is a logical low, while variable current source 18 switches the additional 16 mA of switching current through termination 20 when the differential output is a logical high. For a logical low, all of the variable current is switched to output TX− while a logical high has all the variable or switching current driven to output TX+.

For the logical high state when none of the variable current is switched through TX−, 4 mA of total current is sent through termination 16, for a voltage drop V=I*R=4mA*50-ohm=0.2 volt. Thus a receiver at termination point 17 sees the output TX− as 0.2 volts above the 3-volt termination, or 3.2 volts.

Output TX+ has a full 20 mA switched through termination 20 for the logical high state. The voltage drop through termination 20 is thus V=I*R=20mA*50-ohm=1 volt. A receiver at termination point 19 sees a voltage of 4.0 volts on TX+, while 3.2 volts is observed on TX−, a difference of 0.8 volts.

LOWER-POWER TERMINATION DESIRABLE

While the standard 50-ohm to 3.0-volt termination is effective, active power is consumed by the termination. FIG. 3 shows that the standard 50-ohm to 3.0-volt termination is implemented as a voltage divider which consumes power. Standard termination 16 is a 50-ohm resistor to a 3.0-volt power supply. Unfortunately, a separate 3.0-volt power supply is not usually available. Instead, a voltage divider is used to approximate the termination to a 3-volt supply. Termination 16' is the equivalent to termination 16, using an 82-ohm resistor to a 5-volt power supply and a 130-ohm resistor to ground.

While termination 16' produces equivalent electrical characteristics as termination 16 without using a 3-volt power supply, an additional current path from the 5-volt power supply to ground occurs through termination 16'. A current of over 20 mA is drawn through termination 16'. For lower-power systems, the additional 20 mA for each termination is significant. Thus standard termination is undesirable for lower-power systems.

Some manufactures may continue to use standard terminations, while other manufactures may prefer a lower-power termination. A current driver that offers an option for termination is desirable. However, since the termination changes the voltage characteristics of an output driven by a current driver, the characteristics of the current driver circuit must change to adapt to either kind of termination. Modifying the characteristics of a current driver integrated onto a silicon integrated circuit is difficult since such drivers are complex analog circuits etched into the silicon. Changing a transistor or resistor value on the silicon is not possible after manufacture.

What is desired is a current driver integrated on a CMOS chip without NPN transistors. It is desired to drive either a PECL 100k standard termination or a lower-power termination with the same current driver. It is desirable for the electrical characteristics of the current driver to be modified to match the standard or the low-power termination. A programmable option to modify the current driver for either termination is desirable. It is further desired to further modify the current driver for a smaller voltage swing to further increase switching speed in some applications with more sensitive receivers.

SUMMARY OF THE INVENTION

A complementary metal-oxide-semiconductor (CMOS) pseudo-emitter-coupled-logic (PECL) current driver drives current to differential outputs including a first differential output and a second differential output. The CMOS PECL current driver has a switching node that receives currents to form a switching current.

A first switching transistor has a gate controlled by a first differential input. The gate controls current from the switching node to the first differential output. A second switching transistor has a gate controlled by a second differential input. The gate controls current from the switching node to the second differential output. A first current source is connected to a power supply. It generates a first current.

A first assignment switch is coupled to connect the first current to the switching node when an option signal is in a first state, but it connects the first current to the first differential output and not to the switching node when the option signal is not in the first state. A second current source is connected to a power supply. It generates a second current.

A second assignment switch is coupled to connect the second current to the switching node when an option signal is in a second state. It connects the second current to the second differential output and not to the switching node when the option signal is not in the second state. Thus the first and second currents pass through the first or second switching transistors when the option signal is in the first state, but the first and second currents bypass the first and second switching transistors when the option signal is not in the first state.

In further aspects of the invention. the first assignment switch is a first transistor and a second transistor coupled to receive the first current. The first transistor has a gate coupled to the option signal and a drain connected to the switching node. The second transistor has a gate connected to an inverse of the option signal and a drain connected to the first differential output. The first and second transistors are p-channel MOS transistors.

The second assignment switch is a first transistor and a second transistor coupled to receive the second current. The first transistor has a gate coupled to the option signal and a drain connected to the switching node. The second transistor has a gate connected to an inverse of the option signal and a drain connected to the second differential output. The first and second transistors are p-channel MOS transistors. Thus the first and second currents are coupled to the switching node or to the first or second differential outputs by p-channel transistors.

In further aspects the first and second switching transistors comprise p-channel MOS transistors.

In further aspects of the invention the option signal is in the first state when the first differential output is connected to a termination of a first type and when the second differential output is connected to a termination of the first type. The first type is a resistive termination to an intermediate voltage between a power-supply voltage and a ground.

The option signal is not in the first state when the first differential output is connected to a termination of a second type and when the second differential output is connected to a termination of the second type. The second type is a resistive termination to ground. Thus different termination types are accommodated by the option signal controlling the first and second assignment switches to increase or decrease the switching current.

In still further aspects a transconductance boost means is coupled to the first and second switching transistors. It increases transconductance of the first and the second switching transistors in response to the option signal being in the first state. Thus the transconductance of the first and second switching transistors is increased when the switching current is increased. The transconductance boost means is additional transistors connected in parallel with the first switching transistor and additional transistors connected in parallel with the second switching transistor.

DETAILED DESCRIPTION

The present invention relates to an improvement in CMOS PECL current drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
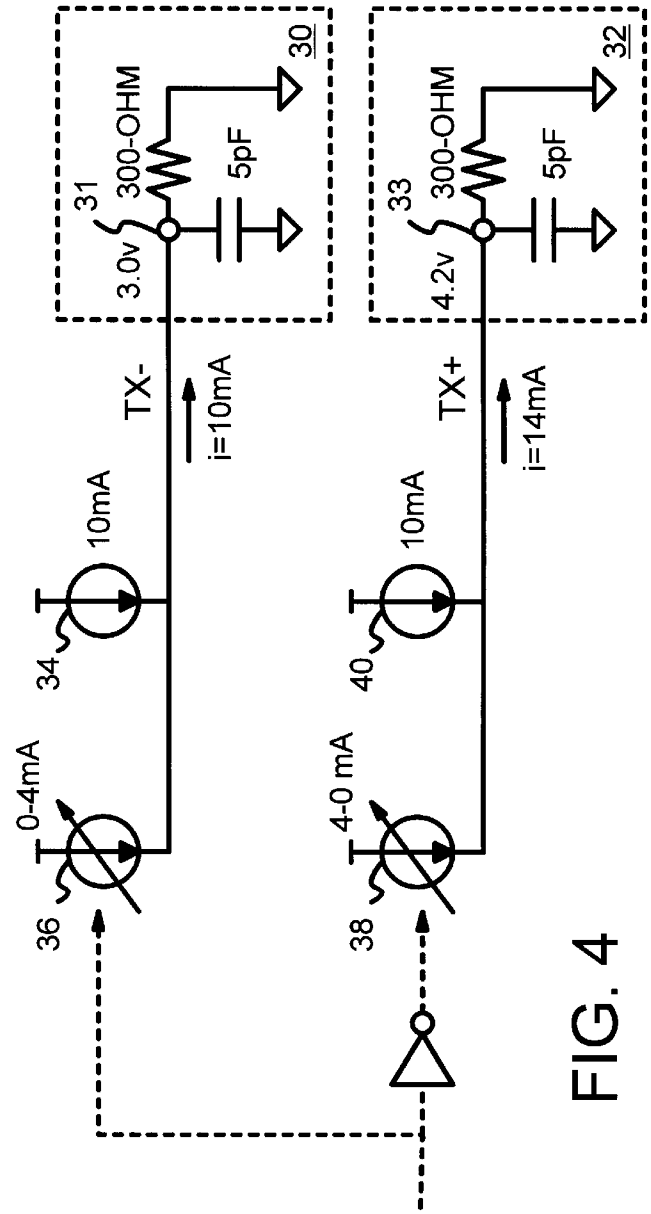
FIG. 4 is a simplified diagram of current drivers for a low-power termination.

FIG. 4 is a simplified diagram of current drivers for a low-power termination. A low-power termination does not have a direct current path from power to ground. Instead, the termination ends at either power or at ground, but not at an intermediate voltage level which must be generated by a voltage divider. Thus termination 30 is a 300-ohm resistor to ground rather than the standard 50-ohm resistor to 3 volts.

Figure 1:
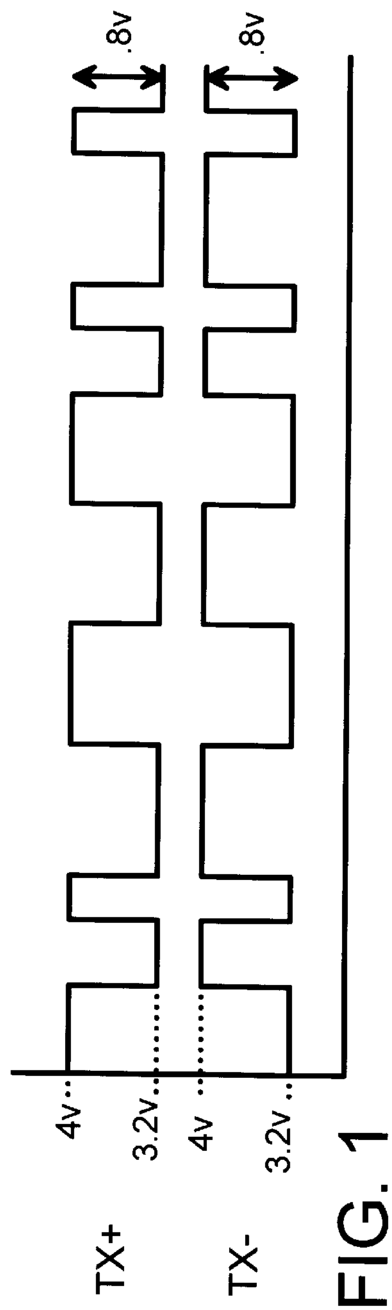
FIG. 1 is a diagram of a differential pair of signals.
Figure 2:
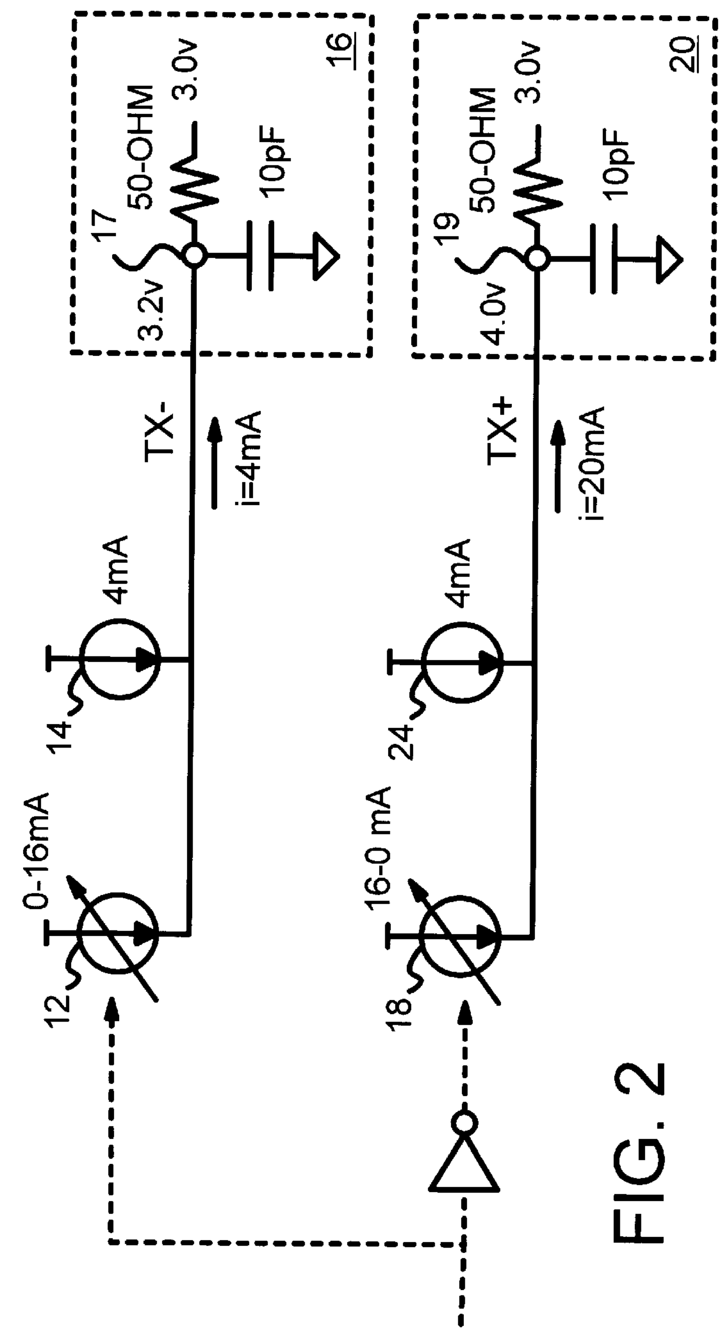
FIG. 2 is a diagram of a differential current driver and line termination which produces the waveforms of FIG. 1.
Figure 3:
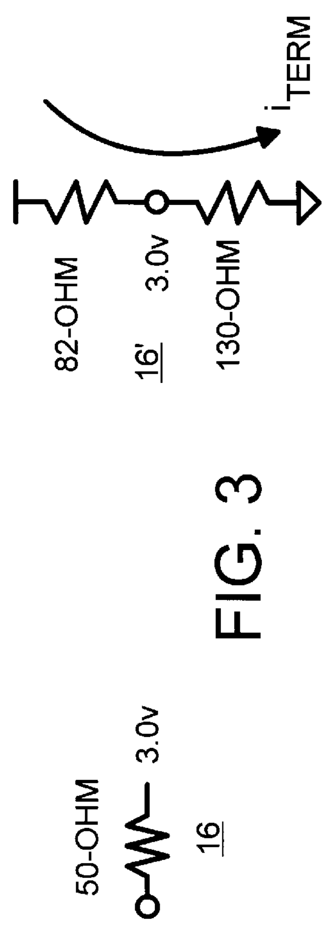
FIG. 3 shows that the standard 50-ohm to 3.0-volt termination is implemented as a voltage divider which consumes power.

When a sufficient bias current is passed through termination 30, then termination point 31 reaches about the same 3-volt bias as the standard termination of FIG. 2. However, a much greater non-switching bias current is required for low-power termination 30. Constant current source 34 forces 10 mA of current through termination 30, while only 4 mA of constant current was used for the standard termination of FIG. 2.

The 10 mA bias current from constant current source 34 produces a 3.0-volt drop through the 300-ohm resistor in termination 30, thus raising the voltage of TX− termination point 31 to 3.0 volts for the logical low when variable current source 36 outputs little or no current.

For the logical high on TX+, variable current source 38 produces 4 mA which is combined with 10 mA of current from constant current source 40 to produce a total current of 14 mA. When 14 mA is forced through termination 32, a 4.2-volt drop occurs to ground. Thus a receiver at termination point 33 observes 4.2 volts while at termination point 31 observes 3.0 volts, a differential of 1.2 volts, about the same swing as standard termination. A larger 1.2-volt swing is used rather than a 0.8-volt swing to compensate for a larger time constant with the large effective resistance of the termination.

For the logical low, the variable current is switched to output TX− rather than TX+, and termination point 31 rises to 4.2 volts while termination point 33 falls to 3.0 volts. During a transition, current is gradually switched from one output to the other and the variable current is divided among the two outputs as the transition occurs, as the variable current gradually shifts to one output.

A 5 pF capacitor rather than the standard 10 pF is used in termination 30, 32 because more advanced receivers with lower input capacitance are often used in such lower-power systems. Symmetry of output rise and fall times is enhanced by the smaller load capacitance.

ACTIVE CURRENT SAME

Since the value of the 300-ohm termination resistor is much larger than the standard 50-ohm termination, a smaller variable current is needed to produce a detectable voltage swing. Thus variable current sources 36, 38 switch only 4 mA of current. Standard termination required that 16 mA of current be switched. While 10 mA of constant current is needed for low-power termination, only 4 mA of switching current was needed for standard termination. Thus a large constant current is required but a smaller variable or switched current with the low-power termination.

The total amount of current out of both TX+ and TX− is 24 mA for both standard and low-power terminations. Thus the same total active power is used by both standard and low-power terminations.

POWER SAVED IN STAND-BY MODE WITH LOW-POWER TERMINATION

The low-power termination of FIG. 4 can save power during a stand-by mode when no transmission is occurring. During stand-by mode, all current sources can be shut off. Since termination 30 has no D.C. current path between power and ground, no stand-by current is drawn. Thus the non-standard, low-power termination reduces power during a stand-by mode. Depending on network traffic, power can be drastically reduced if current sources are shut down when no network traffic is transmitted, such as at night or on an infrequently-used local node.

ASSIGNMENT OF CURRENTS TO SWITCHING OR CONSTANT

The inventors have realized that the electrical characteristics of a current driver can be altered to match different terminations by assigning current either to the switching current or to the constant current. A current driver with the characteristics of both FIGS. 2 and 4 can be implemented in CMOS by assigning currents to switching or constant currents.

Standard termination requires large switching currents and small constant currents, while low-power termination requires small switching currents but larger constant currents. Thus either type of termination can be matched by assigning a large portion of the current to either switching current for standard termination or to constant current for low-power termination.

DIFFERENTIAL CURRENT DRIVER CIRCUIT-FIG. 5

Figure 5:
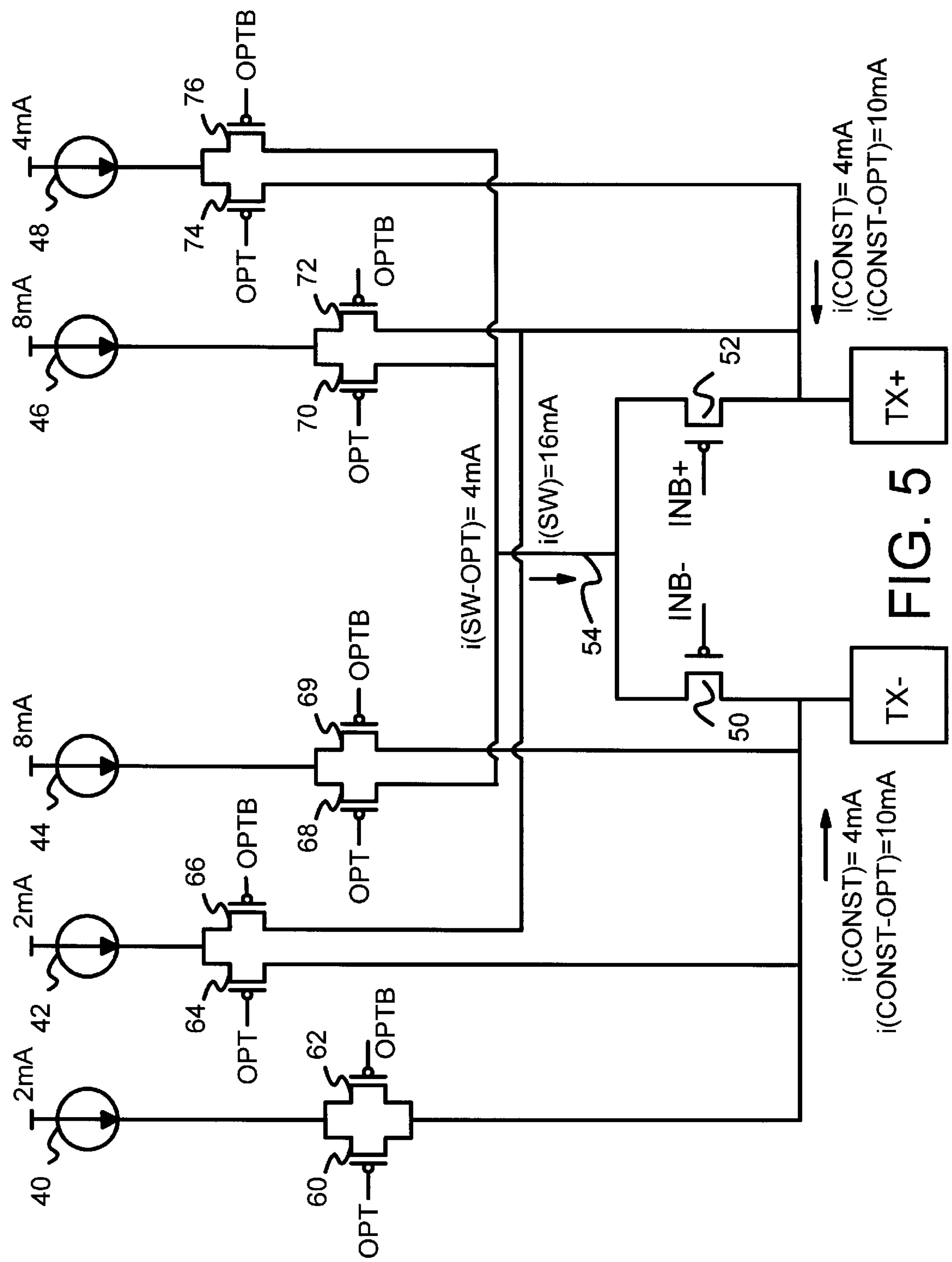
FIG. 5 is a schematic diagram of a differential-output current driver with an option to assign current sources to switching currents or constant currents.

FIG. 5 is a schematic diagram of a differential-output current driver with an option to assign current sources to switching currents or constant currents. Assignment of currents to either switching or constant currents is accomplished by pairs of p-channel MOS transistors connected to current sources. Assignment transistors 60–76 of FIG. 5 perform the assignment of currents from current sources 40–48. Constant current is applied directly to the TX− or TX+ outputs, while switching current must pass through a differential pair of switching transistors 50, 52 to be switched to either TX+ or TX−.

When a current is assigned to switching current, one of the assignment transistors couples the current source to switching node 54, which supplies current to a differential pair of PMOS switching transistors 50, 52. The drains of switching transistors 50, 52 are connected to output the switching current from switching node 54 to outputs TX− and TX+, respectively.

To assign currents for standard termination, option signal OPT is driven low and its inverse OPTB is driven high. Option signal OPT can be driven by a programmable register or by a bonding option such as an extra bonding pad on the silicon die that is connected by a bonding wire to ground or power, depending on the desired mode. For each pair of assignment transistors 60–76, one assignment transistor has its gate controlled by option signal OPT, while the other assignment transistor has its gate controlled by the inverse option signal OPTB.

Current sources 44, 46 are each 8 mA current sources. Transistors 68, 70 switch all 16 mA from current sources 44, 46 to switching node 54 when OPT is low, supplying the 16 mA switching current for standard termination. However, when OPT is high for low-power termination, current source 44 is coupled directly to output TX− by assignment transistor 69, supplying 8 mA of constant current to TX−. Current source 46 supplies 8 mA of constant current to the other output TX+ through assignment transistor 72. Thus each 8 mA current source is assigned to either switching current for standard termination (OPT=0) or constant current (OPT=1).

Assignment transistors 74, 76 connect current source 48 to switching node 54 when OPT is high, but to output TX+ when OPT is low. Thus assignment transistors 74, 76 supply the 4 mA switching current for low-power termination, when OPT is high, but supply the 4 mA constant current for TX+ when OPT is low.

Since current sources 44, 46 each supply only 8 mA of the 10 mA constant current for low-power termination when OPT is high, an additional 2 mA of constant current is needed for each output for option mode. Current sources 40, 42 are each 2 mA current sources. Current source 40 always supplies 2 mA of current to output TX−, while current source 42 is assigned to supply its 2 mA of current to output TX− in standard mode, but to the other output TX+ in option mode. Thus the additional 2 mA of constant current for low-power termination mode is supplied to output TX− by current source 40 through transistor 62, and to output TX+ by current source 42 through assignment transistor 66.

For standard termination when OPT is low, the 4 mA constant current for output TX− is supplied by current sources 40, 42 through transistors 60, 64, respectively. PMOS transistors 60, 62 are used even though current source 40 is always assigned to output TX−. PMOS transistors 60, 62 are used to accurately match currents with other current sources through the other assignment transistors, so that all current sources go through a similar resistance from the assignment transistors.

SUMMARY OF CURRENT ASSIGNMENTS

Table 1 summarizes how each current source is assigned to switching current (SW), constant current to output TX−, or constant current to output TX+.

TABLE 1

Current Assignments

| Current Source Ref. # | Current Assigned | OPT = 0 Std. Term. | OPT = 1 Low-Power Term. |
|---|---|---|---|
| 40 | 2 mA | TX− | TX− |
| 42 | 2 mA | TX− | TX+ |
| 44 | 8 mA | SW | TX− |
| 46 | 8 mA | SW | TX+ |
| 48 | 4 mA | TX+ | SW |

Table 1 shows that for standard termination (OPT=0), the total switching current SW is 16 mA (8 mA+8 mA), while the constant current to each output is 4 mA. For the low-power termination (OPT=1), total switching current is 4 mA while constant current to each output is 10 mA (8 mA+2 mA).

OPERATION OF DIFFERENTIAL TRANSISTORS

Referring back to FIG. 5, as the voltage on input INB− falls, PMOS switching transistor 50 has a higher absolute gate-to-source voltage and increases current drive. As the voltage on input INB+ rises, PMOS switching transistor 52 has a lower absolute gate-to-source voltage and thus a lower current drive. A greater amount of the switching current from switching node 54 is thus switched through transistor 50 to output TX− while less current is switched through transistor 52 to output TX+. Thus a greater and greater portion of the switching current is switched through transistor 50 to output TX− as input INB− falls.

MATCHING DIFFERENTIAL SWITCHING TRANSISTORS-FIG. 6

Figure 6:
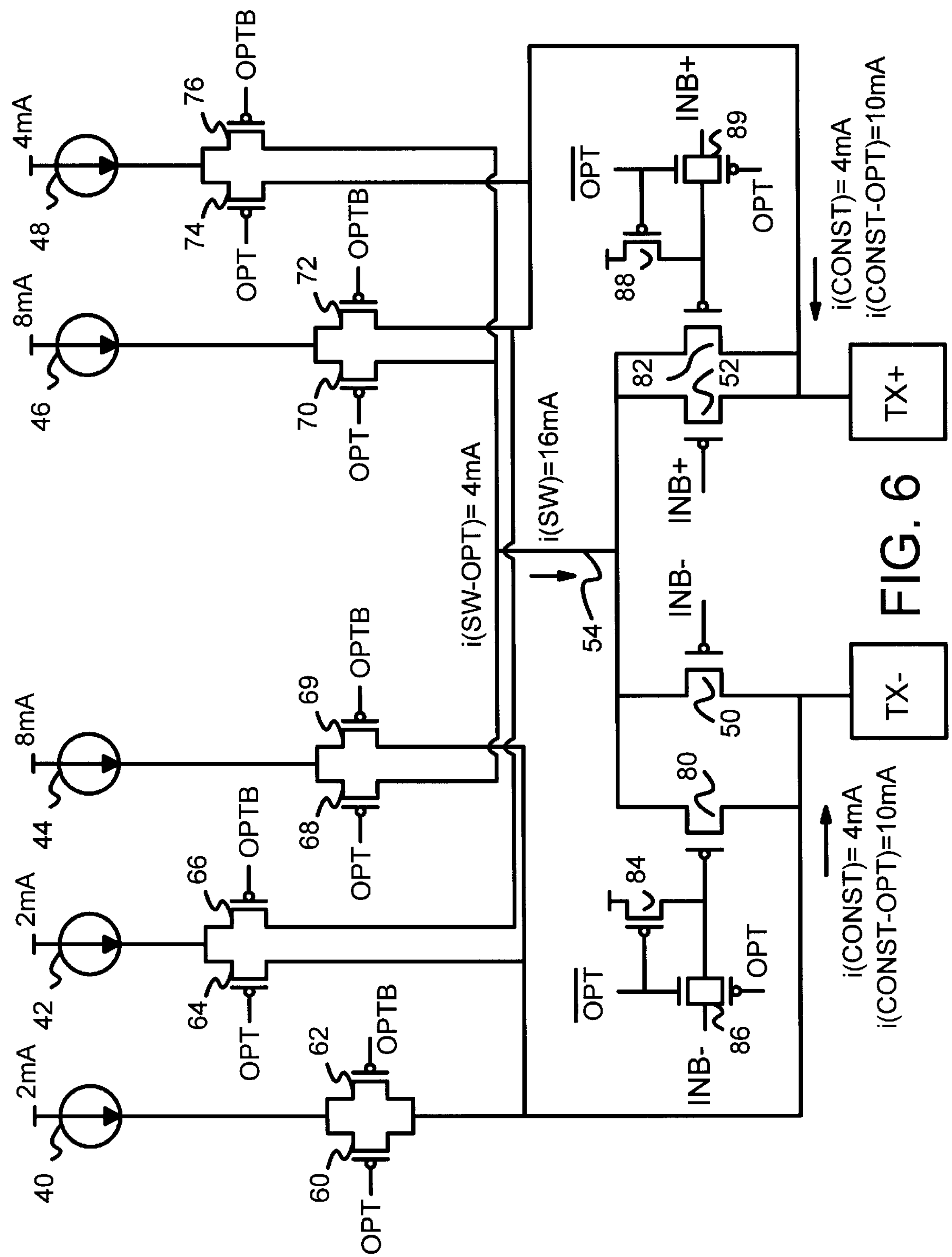
FIG. 6 is a differential-output current driver with assigned currents with increased transconductance of differential switching transistors when switching current is increased.

FIG. 6 is a differential-output current driver with assigned currents with increased transconductance of differential switching transistors when switching current is increased. FIG. 6 shows an enhancement to the current driver of FIG. 5; thus only the enhancements are described below. Other circuitry has been described in reference to FIG. 5.

Increasing the switching current for standard termination relative to low-power termination produces an unwanted secondary effect. The 16 mA of switching current for standard-termination mode causes an increased voltage drop through switching transistors 50 ,52 compared to low-power mode when only 4 mA is switched through transistors 50, 52. Since the switching current increases by a factor of four, the I*R drop thorough each switching transistors also increases. This is undesirable as the receiver observes a lower voltage at the termination points. A lower gain leads to slower and unmatched transient performance for different terminations.

The increased resistance can be eliminated by increasing the transconductance of switching transistors 50, 52 for standard-termination mode. Additional switching transistors 80, 82 have triple the transconductance of switching transistors 50, 52. The triple transconductance is achieved by tripling the number of legs of polysilicon gates in transistors 80, 82 relative to transistors 50, 52, increasing the effective width W of the composite transistors.

An enabling mechanism is provided to enable transistors 80, 82 during standard-termination mode but to disable them during low-power-termination (option) mode. Transmission gates 86, 89 connect inputs INB−, INB+ to the gates of transistors 80, 82 respectively when option signal OPT is low. This enables additional switching transistors 80, 82 for standard-termination mode.

When option signal OPT is high, transmission gates 86, 89 disconnect inputs INB−, INB+ from the gates of additional switching transistors 80, 82. PMOS pullup transistors 84, 88 drive the gates of additional switching transistors 80, 82 high, disabling them. Thus additional switching transistors 80, 82 are disabled for option mode when only 4 mA of switching current is required, but enabled for standard-termination mode when 16 mA of switching current is needed.

The effective resistance of the differential pair of switching transistors is thus kept constant for both standard and low-power-termination modes by the enhancements of FIG. 6.

LOW-SWING OPTION-FIG. 7

For sensitive receivers with low capacitive loading, even smaller voltage swings of ½ $V_{BE}$ or less are needed for lower noise and faster operation. While the PECL 100k standard calls for a 0.8-volt peak-to-peak swing, some receivers can detect a 0.4-volt or smaller differential swing. Reduced output swings can be faster or lower in active power consumption as capacitances are charged across a smaller voltage range, requiring that less charge be moved by the current driver. Thus a half-swing option is desirable for a current driver.

Figure 7:
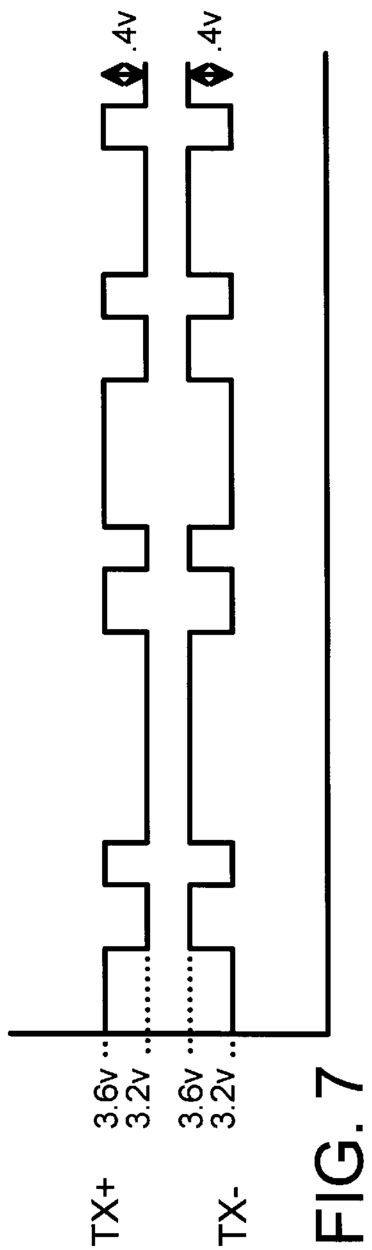
FIG. 7 shows waveforms for differential outputs with a reduced output swing.

FIG. 7 shows waveforms for differential outputs with a reduced output swing. Outputs TX+ and TX− swing from 3.2 volts to 3.6 volts, a swing of 0.4 volts. When TX+ transitions low to 3.2 volts, output TX− transitions high to 3.6 volts, and when TX+ transitions high, TX− transitions low.

Figure 8:
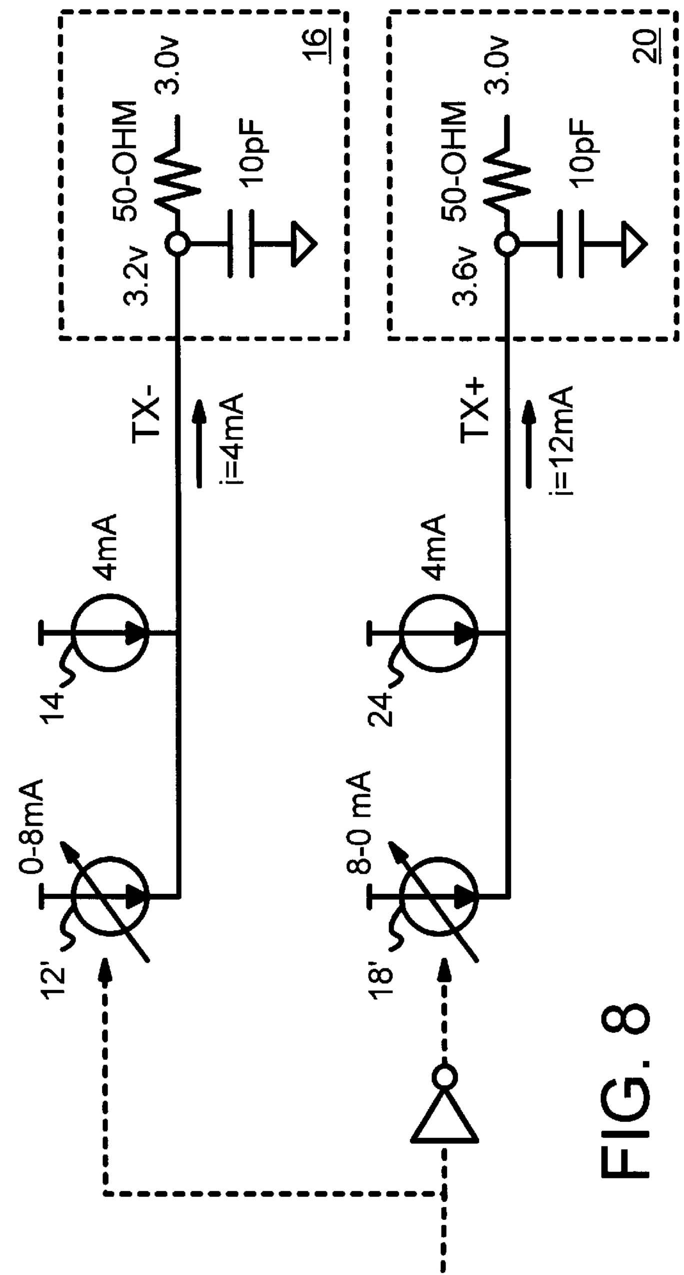
FIG. 8 is a simplified diagram of a current driver operating in a half-swing mode such as shown in FIG. 7.

FIG. 8 is a simplified diagram of a current driver operating in a half-swing mode such as shown in FIG. 7. Constant current sources 14, 24 supply a constant current of 4 mA into outputs TX−, TX+, respectively. Variable current sources 12' 18' supply only 8 mA of switching current rather than 16 mA of switching current as shown in FIG. 2. Halving the switching current reduces the output swing by half.

In the logical high state, output TX− is low at 3.2 volts, since variable current source 12' is outputting little or no current. The 50-ohm resistor to an equivalent 3 volts in standard termination 16 produces a 0.2-volt IR drop for the 4 mA current from constant current source 14.

Output TX+ is high when variable current source 18' outputs all 8 mA through output TX+ and termination 20. The total current of 12 mA produces a 0.6 volt IR drop through the 50-ohm resistor in termination 20. Thus the termination point of output TX+ is at 3.6 volts, while the termination point of output TX− is at 3.2 volts. A receiver observes a voltage differential of 0.4 volts. As outputs TX+ and TX− change logical state and switch between high and low levels of 3.2 and 3.6 volts, a reduced swing of 0.4 volts is observed by a receiver.

HALF-SWING OPTION-FIG. 9

Figure 9:
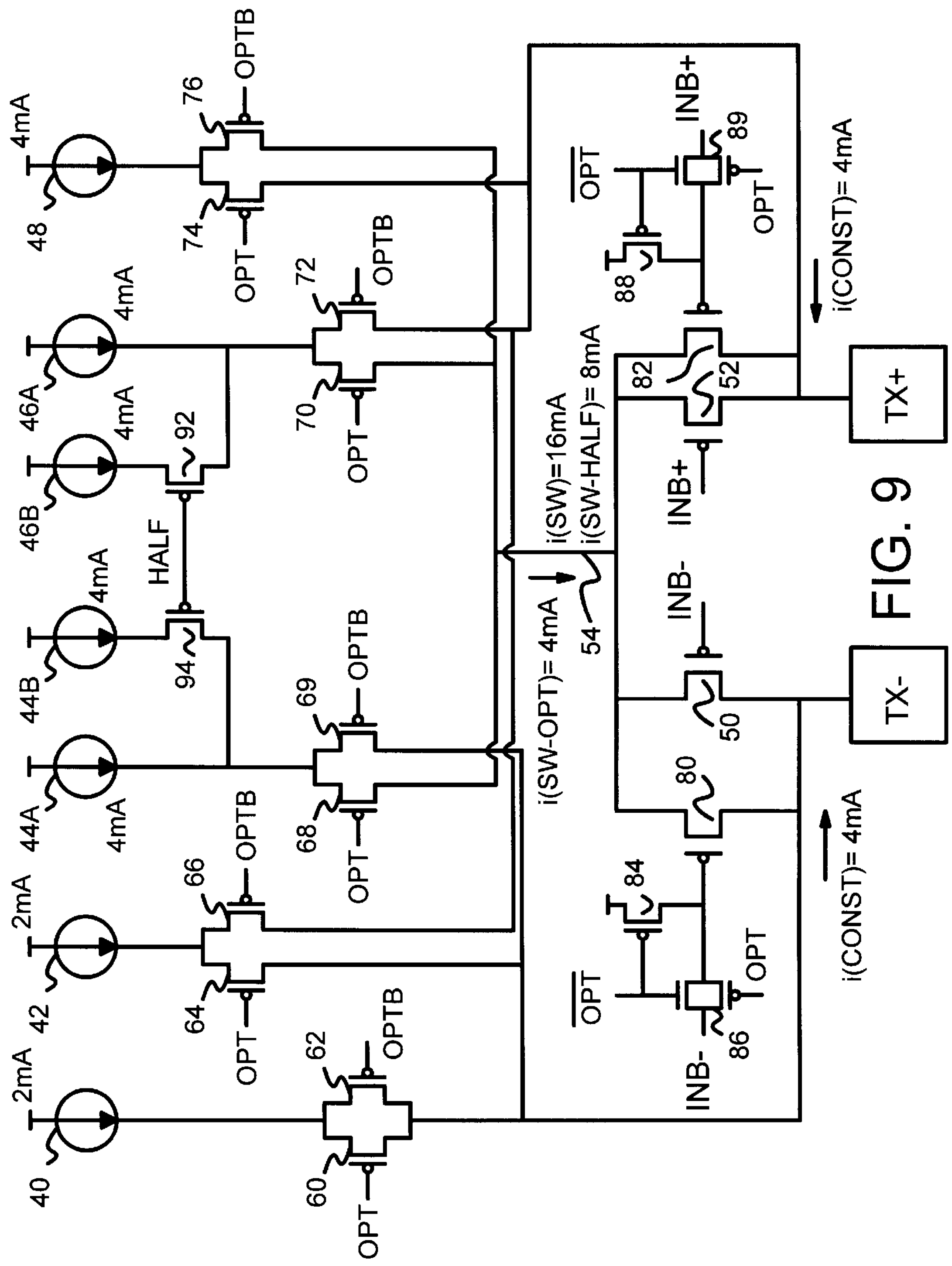
FIG. 9 is a circuit schematic of a differential-output current driver with an option for producing a half-sized output swing for standard termination.

FIG. 9 is a circuit schematic of a differential-output current driver with an option for producing a half-sized output swing for standard termination. FIG. 9 is an enhancement of the current driver of FIG. 6 and only the enhancement is described below.

Halving the output swing is accomplished by cutting the switching current in half while maintaining the same constant current. For standard-termination mode, the 16 mA switching current is provided by the two 8 mA current sources 44, 46 described in FIG. 5. While one of these two current sources could be disabled, the voltage drops through the assignment transistors are reduced by halving each of the two current sources. This maintains as much symmetry as possible for consistent performance in different modes.

The 8 mA current sources are each divided into two 4 mA current sources 44A, 44B, and 46A. 46B. During standard-termination, full-swing mode, signal HALF is low, enabling halving transistors 92, 94 so that the full 16 mA of switching current is delivered to switching node 54 and switching transistors 50, 52. During half-swing mode, signal HALF is high, disabling halving transistors 92, 94. Current sources 44B, 46B are then disconnected from switching node 54 and the switching current is reduced to the 8 mA supplied by current sources 44A, 46A.

Half-swing mode is only allowed for standard termination. It is not supported in this embodiment for low-power termination. Thus signal HALF must be low when option signal OPT is high. Of course, one skilled in the art can implement a half-swing mode for low-power termination.

CURRENT SOURCES-FIG. 10

Figure 10:
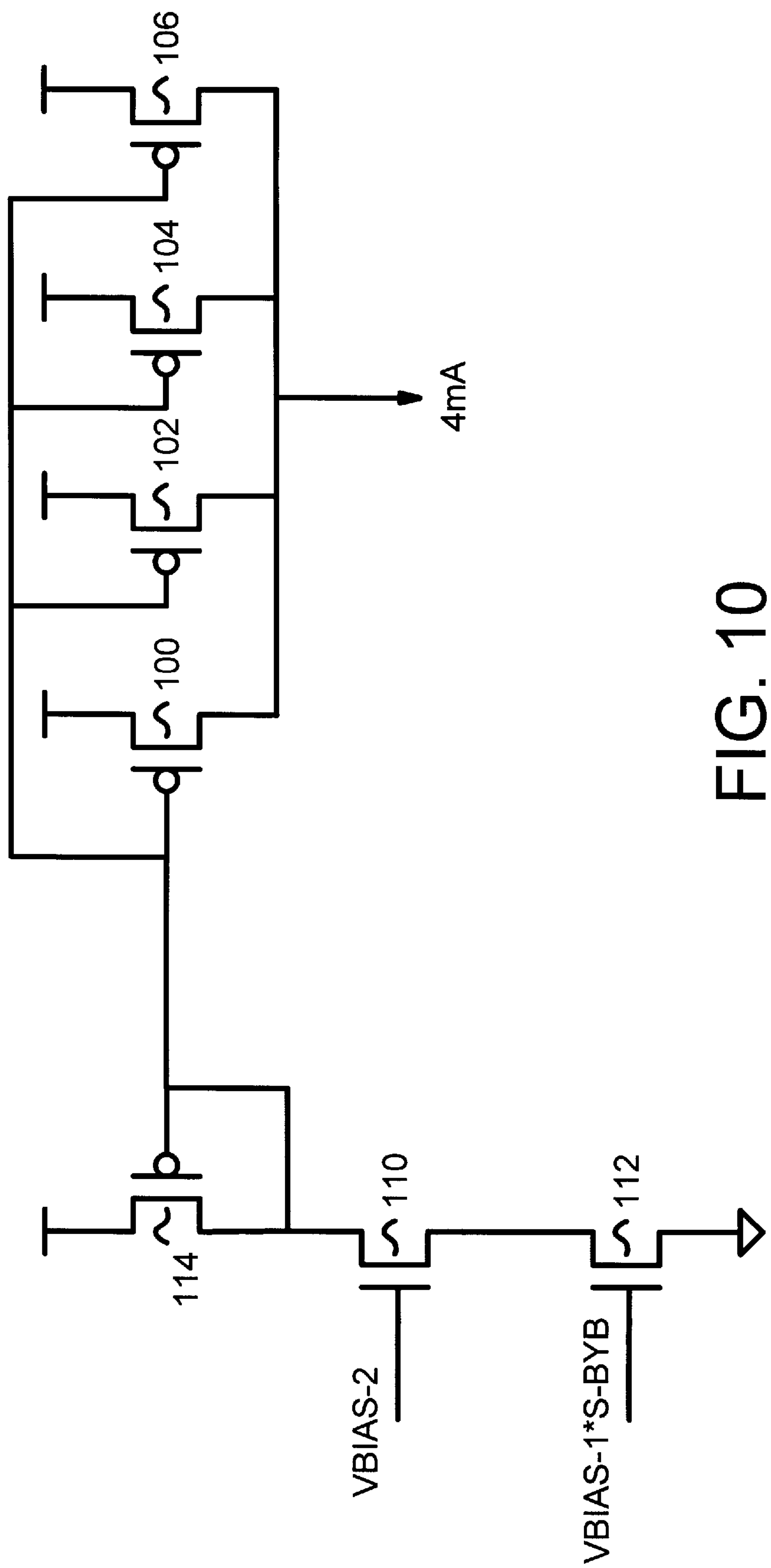
FIG. 10 is a diagram of a current source and a bias-voltage generator.

FIG. 10 is a diagram of a current source and a bias-voltage generator. PMOS transistors 100, 102, 104, 106 have sources connected to the 5-volt power supply and drains outputting a total of 4 mA of current. This current remains constant because the gate-to-source voltages do not depend on the drain/output voltage.

The gates of transistors 100, 102, 104, 106 are biased at a desired bias point by PMOS transistor 114, which has its gate and drain tied together to force operation in the saturation mode of operation. The current through transistor 114 is thus mirrored to transistors 100, 102, 104, 106.

NMOS biasing transistors 110, 112 form a cascade current source. The bias voltage to transistors 110, 112 can be developed by a band-gap reference and an external resistor forming a replica biased cascode current source to compensate for temperature and process variations.

STAND-BY MODE FOR CURRENT SOURCES

The bias voltage to transistor 112 can be gated with a stand-by signal to disable all current sources in a power-down mode. Disabling transistor 112 causes the gate voltage of transistor 114 to rise until transistor 114 is turned off. PMOS transistors 100, 102, 104, 106 in the current source are then also disabled. When combined with the low-power termination, such a power-down mode can substantially reduce power consumption.

The biasing arrangement formed by transistors 114, 110, 112 can be used to supply the gate-reference voltage for many current sources, such as current sources 40, 42, 44, 46, and 48 of FIG. 5.

In one embodiment, each of transistors 100–106 are composed of 10 legs of 20-micronwide, 2-micron length transistors (10×20/2) to output a total of 4 mA. Transistor 114 is also a 10×20/2 device, while transistor 110 is a 10×8/.8 NMOS device and transistor 112 is a 10×15/1.5 NMOS device. All assignment transistors are 30/.6 PMOS devices with 3 legs for the 2 mA current sources, 6 legs for the 4 mA sources, and 12 legs for the 8 mA sources. The halving transistors have 6 legs each. The switching transistors are 6 legs of 12/.6, with another 18 legs for each additional switching transistor.

ADVANTAGES OF THE INVENTION

The invention provides pseudo-ECL levels meeting the 100k PECL specification, while using only CMOS transistors which are easily integrated on chips made from standard CMOS processes. Bipolar NPN transistors do not have to be added to the CMOS process. Thus cost is reduced relative to BiCMOS circuits.

A single current driver circuit can be used for either standard or non-standard, low-power termination. The driver changes the amount of switching current and constant currents to match the current required for the termination used. Currents are assigned to either switching or constant currents by the selection or assignment transistors. Thus current sources do not have to be shut down but can remain in a steady state, allowing very high-speed switching. A single chip can be used for either standard or low-power applications rather than requiring that two separate chips be manufactured and stocked.

Total variations in current drive of less than 5% are achievable when an on-chip band-gap reference is used with an external precision resistor to set the gate-bias voltage of the current sources. Duty-cycle-distortion is less than 0.4 nanoseconds (ns), worst-case. Rise and fall times of the outputs are matched, with a rise/fall delay of 2.5 ns for standard termination and 10 pF loads, or 4 ns for the low-power termination with 5 pF loads.

ALTERNATE EMBODIMENTS

Several other embodiments are contemplated by the inventors. For example the current sources can be biased by other types of voltage dividers or biasing circuits. The current drivers can be used with other types or arrangements of termination, and with other output levels beside PECL. The options described herein can be combined in other combinations or alone, and other programmable options may be added. One skilled in the art will recognize that the invention can be applied to other voltage swings with other termination types. N-bit-wide controls can be used to control assignment of $2^N$ current sources or sinks. The terminations and switching or constant currents can be referenced to ground rather than to power as described in the preferred embodiment.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A complementary metal-oxide-semiconductor (CMOS) pseudo-emitter-coupled-logic (PECL) current driver for driving current to differential outputs including a first differential output and a second differential output, the CMOS PECL current driver comprising:

a switching node for receiving currents to form a switching current;

a first switching transistor having a gate controlled by a first differential input, the gate controlling current from the switching node to the first differential output;

a second switching transistor having a gate controlled by a second differential input, the gate controlling current from the switching node to the second differential output;

a first current source, connected to a power supply, for generating a first current;

a first assignment switch, coupled to connect the first current to the switching node when an option signal is in a first state, but connecting the first current to the first differential output and not to the switching node when the option signal is not in the first state;

a second current source, connected to a power supply, for generating a second current; and a second assignment switch, coupled to connect the second current to the switching node when an option signal is in a second state, but connecting the second current to the second differential output and not to the switching node when the option signal is not in the second state, whereby the first and second currents pass through the first or second switching transistors when the option signal is in the first state, but the first and second currents bypass the first and second switching transistors when the option signal is not in the first state.

2. The CMOS PECL current driver of claim 1 wherein the first assignment switch comprises a first transistor and a second transistor coupled to receive the first current, the first transistor having a gate coupled to the option signal and a drain connected to the switching node, the second transistor having a gate connected to an inverse of the option signal and a drain connected to the first differential output, the first and second transistors being p-channel MOS transistors and wherein the second assignment switch comprises a first transistor and a second transistor coupled to receive the second current, the first transistor having a gate coupled to the option signal and a drain connected to the switching node, the second transistor having a gate connected to an inverse of the option signal and a drain connected to the second differential output, the first and second transistors being p-channel MOS transistors, whereby the first and second currents are coupled to the switching node or to the first or second differential outputs by p-channel transistors.

3. The CMOS PECL current driver of claim 2 wherein the first and second switching transistors comprise p-channel MOS transistors.

4. The CMOS PECL current driver of claim 1 further comprising:

a third current source for supplying a third current;

a third assignment switch, coupled to connect the third current to the second differential output when the option signal is in the first state but connecting the third current to the switching node when the option signal is not the in first state, whereby the third current is assigned to either the second differential output or to the switching node in response to the option signal.

5. The CMOS PECL current driver of claim 4 further comprising:

a fourth current source for supplying a fourth current;

a fourth assignment switch, coupled to connect the fourth current to the first differential output when the option signal is in the first state but connecting the fourth current to the second differential output when the option signal is not the in first state, whereby the fourth current is assigned to either the first or the second differential output in response to the option signal.

6. The CMOS PECL current driver of claim 5 further comprising:

a fifth current source for supplying a fifth current;

a fifth assignment switch, coupled to always connect the fifth current to the first differential output, whereby the fifth current is always assigned to the first differential output.

7. The CMOS PECL current driver of claim 1 wherein the option signal is in the first state when the first differential output is connected to a termination of a first type and when the second differential output is connected to a termination of the first type, the first type comprising a resistive termination to an intermediate voltage between a power-supply voltage and a ground, and wherein the option signal is not in the first state when the first differential output is connected to a termination of a second type and when the second differential output is connected to a termination of the second type, the second type comprising a resistive termination to ground, whereby different termination types are accommodated by the option signal controlling the first and second assignment switches to increase or decrease the switching current.

8. The CMOS PECL current driver of claim 7 further comprising:

transconductance boost means, coupled to the first and second switching transistors, to increase transconductance of the first and the second switching transistors in response to the option signal being in the first state, whereby the transconductance of the first and second switching transistors is increased when the switching current is increased.

9. The CMOS PECL current driver of claim 8 wherein the transconductance boost means comprises additional transistors connected in parallel with the first switching transistor and additional transistors connected in parallel with the second switching transistor.

10. The CMOS PECL current driver of claim 1 wherein the first current and the second current are matched, having the same value of current, and wherein the third current is substantially half of the first current and wherein the fourth and fifth currents are each substantially one-quarter of the first current.

11. The CMOS PECL current driver of claim 10 wherein the switching current is increased by a factor of four when the option signal is in the first state than when not in the first state, and wherein a constant current to the first differential output but not through the first switching transistor is decreased by a factor of 2.5 when the option signal is in the first state than when not in the first state, whereby current is transferred from the constant current to the switching current through the switching transistors when the option signal is in the first state.

12. The CMOS PECL current driver of claim 10 wherein the switching current is reduced by half in response to a half-swing option signal, whereby a voltage swing of the first differential output and of the second differential output is reduced by half in response to the half-swing option signal.

13. A differential current driver comprising:

a differential pair of outputs including a first output and a second output;

a differential pair of inputs including a first input and a second input;

a differential pair of switching transistors including a first switching transistor having a first gate controlled by the first input and a second switching transistor having a second gate controlled by the second input, the first and second switching transistors connected to receive a switching current from a switching node, the first switching transistor connected to control a first portion of the switching current from the switching node to the first output in response to changes in the first input, the second switching transistor connected to control a second portion of the switching current from the switching node to the second output in response to changes in the second input;

a plurality of current sources for supplying a plurality of supplied currents; and a plurality of assignment switches, coupled to the plurality of current sources and coupled to the switching node, for switching each of the supplied currents to either the switching node or to the first output or to the second output, whereby each of the supplied currents from the plurality of current sources are switched to be the switching current through the differential pair of transistors or directly to the first or second outputs as constant currents.

14. The differential current driver of claim 13 wherein the differential pair of switching transistors comprise a pair of p-channel metal-oxide-semiconductor (MOS) transistors having sources connected together and to the switching node to receive the switching current, the first switching transistor having a drain connected to the first output and the second switching transistor having a drain connected to the second output.

15. The differential current driver of claim 14 wherein each assignment switch in the plurality of assignment switches comprises a pair of p-channel MOS transistors having sources connected together to receive a supplied current from a current source.

16. The differential current driver of claim 15 wherein the pair of p-channel MOS transistors in each assignment switch includes a first assignment transistor controlled by a first signal and a second assignment transistor controlled by a second signal, wherein the first signal is a logical inverse of the second signal, wherein all the supplied current from the current source connected to the assignment switch is conducted through either the first assignment transistor or through the second assignment transistor in response to the first and second signals, wherein the supplied current is switched through one of the assignment transistors.

17. The differential current driver of claim 16 wherein the first output is connected to a termination of a first termination type and the second output is connected to a termination of the first termination type when the first signal is active and the second signal is inactive, but when the first signal is inactive the first output is connected to a termination of a second termination type and the second output is connected to a termination of the second termination type, whereby the first signal assigns supplied currents to the switching current or to the constant currents from the plurality of current sources to adjust for the first of second termination type.

18. The differential current driver of claim 17 wherein the first termination type is a resistor to an intermediate voltage between the power-supply voltage and ground, and wherein the second termination type is a resistor connected to ground, whereby the second termination type is a low-power termination not using an intermediate voltage.

19. The differential current driver of claim 18 wherein some of the supplied currents are assigned to the switching current when the first signal is active and the first termination type is connected to the first and second outputs, but assigned to the constant currents when the first signal is inactive and the second termination type is connected to the first and second outputs, whereby supplied currents are transferred from the switching current to the constant currents in response to the first signal and the termination type.

20. The differential current driver of claim 19 further comprising:

means to disable the plurality of current sources when a stand-by mode is activated to reduce power consumption when no network traffic is being transmitted out the first and second outputs.

21. A current driver circuit comprising:

a first p-channel output transistor having a drain connected to a first output and a source connected to a switching node, the first p-channel output transistor having a gate connected to a first differential input;

a second p-channel output transistor having a drain connected to a second output and a source connected to a switching node, the second p-channel output transistor having a gate connected to a second differential input;

current sources for supplying currents; and assignment switches, connected to the current sources, for routing currents to the switching node or directly to either the first or the second outputs in response to an option signal indicating a termination type connected to the first and second outputs, whereby the currents are routed through the output transistors or bypassed around the output transistors in response to the termination type.

22. The current driver circuit of claim 21 wherein the currents are divided by the assignment switches into switching currents routed through the output transistors and constant currents bypassed around the output transistors, wherein the switching current is always greater than zero and wherein the constant currents are always greater than zero during operation, wherein the ratio of the switching current to the constant currents is altered in response to the termination type.

23. The current driver circuit of claim 22 wherein the first differential input transitions in an opposite direction when the second differential input transitions, causing the first output to transition in an opposite direction from the second output, whereby the first and second outputs together encode and transmit one bit of information.

* * * * *